US011489058B2

(12) United States Patent
Cheng et al.

(10) Patent No.: US 11,489,058 B2
(45) Date of Patent: Nov. 1, 2022

(54) SEMICONDUCTOR STRUCTURE AND ASSOCIATED MANUFACTURING METHOD

(71) Applicant: TAIWAN SEMICONDUCTOR MANUFACTURING COMPANY LTD., Hsinchu (TW)

(72) Inventors: Hsin-Li Cheng, Hsinchu County (TW); Yu-Chi Chang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 203 days.

(21) Appl. No.: 16/368,860

(22) Filed: Mar. 29, 2019

(65) Prior Publication Data

US 2020/0035802 A1    Jan. 30, 2020

Related U.S. Application Data

(60) Provisional application No. 62/711,064, filed on Jul. 27, 2018.

(51) Int. Cl.
*H01L 29/45*     (2006.01)
*H01L 29/78*     (2006.01)
*H01L 29/40*     (2006.01)
*H01L 29/66*     (2006.01)
*H01L 21/762*    (2006.01)
*H01L 21/8234*   (2006.01)

(52) U.S. Cl.
CPC ...... *H01L 29/456* (2013.01); *H01L 21/76224* (2013.01); *H01L 21/823481* (2013.01); *H01L 29/401* (2013.01); *H01L 29/66477* (2013.01); *H01L 29/78* (2013.01)

(58) Field of Classification Search
CPC ........... H01L 29/456; H01L 21/823481; H01L 29/78; H01L 29/401; H01L 29/66477; H01L 21/76224; H01L 29/6656; H01L 29/66568

See application file for complete search history.

(56) References Cited

U.S. PATENT DOCUMENTS

| | | | |
|---|---|---|---|
| 10,797,134 B2* | 10/2020 | Kim | H01L 21/76224 |
| 2002/0056879 A1* | 5/2002 | Wieczorek | H01L 23/5222 |
| | | | 257/368 |
| 2009/0224335 A1* | 9/2009 | Chang | H01L 29/4238 |
| | | | 257/396 |
| 2011/0171810 A1 | 7/2011 | Tseng et al. | |
| 2012/0058613 A1 | 3/2012 | Oh et al. | |

(Continued)

OTHER PUBLICATIONS

Office Action and Search Report dated Jun. 29, 2020 issued by Taiwan Intellectual Property Office for counterpart application 108125863.

*Primary Examiner* — Shahed Ahmed
*Assistant Examiner* — Sun Mi Kim King
(74) *Attorney, Agent, or Firm* — WPAT Law; Anthony King (57) ABSTRACT

A semiconductor structure is disclosed. The semiconductor structure includes: a substrate; an active area including a channel region sandwiched between two source/drain regions; an insulation region surrounding the active area from a top view; and a dielectric layer disposed over and in contact with an interface between the insulation region and the source/drain regions. A method of manufacturing the same is also disclosed.

20 Claims, 12 Drawing Sheets

(56) References Cited

U.S. PATENT DOCUMENTS

| | | |
|---|---|---|
| 2012/0156839 A1 | 6/2012 | Scheiper et al. |
| 2013/0299919 A1* | 11/2013 | Chen .................. H01L 29/6656 257/408 |
| 2016/0093715 A1* | 3/2016 | Liu .................. H01L 29/66795 257/401 |
| 2016/0133748 A1 | 5/2016 | Kang et al. |

* cited by examiner

SEMICONDUCTOR STRUCTURE AND ASSOCIATED MANUFACTURING METHOD

CROSS REFERENCE TO RELATED APPLICATIONS

This application claims the benefit of U.S. provisional application Ser. 62/711,064, filed on Jul. 27, 2018, which is incorporated by reference in its entirety.

BACKGROUND

Shallow trench isolations (STI) are widely used in semiconductors manufacturing to provide isolation of active areas on a substrate. However, STI are susceptible to noise and leakage problems. Therefore, there is a need to mitigate the above mentioned issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS), in particular MOS employed by full-custom integrated circuit design, and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily, or permanently, noise margin degradation, voltage shift and cross-talk.

Shallow trench isolation (STI), is an electrical isolation technique for a semiconductor chip with high integration. STI structures can be made using a variety of methods including, for example, the Buried Oxide (BOX) isolation method for shallow trenches. The BOX method involves filling the trenches with a chemical vapor deposition (CVD) silicon oxide ($SiO_2$) which is then planarized by a plasma etched back process and/or a chemical mechanical polishing (CMP) process to yield a planar surface. The shallow trenches etched for the BOX process are anisotropically plasma etched into the substrate, for example, silicon, and are typically between about 0.3 and about 1.0 microns deep.

A silicide layer is usually formed atop silicon structures, such as polysilicon gates, source/drain regions and local interconnects, in a semiconductor device in order to reduce a contact resistance when forming gate or source/drain contacts. In the process of forming the silicide layer, a dielectric layer may be used to cover some parts of the silicon structures and expose some predetermined areas. A metal layer is blanket deposited over the dielectric layer and exposed areas. A thermal treatment is then performed to facilitate a chemical reaction where the metal layer is in contact with the silicon structures to form the silicide layer. Because the dielectric layer shields a part of the semiconductor device from the metal layer, no silicide layer would be formed on the portions covered by the dielectric layer in the course of the thermal treatment. The unreacted part of the metal layer is then stripped, leaving the silicide layer on desired areas.

Figure 1:
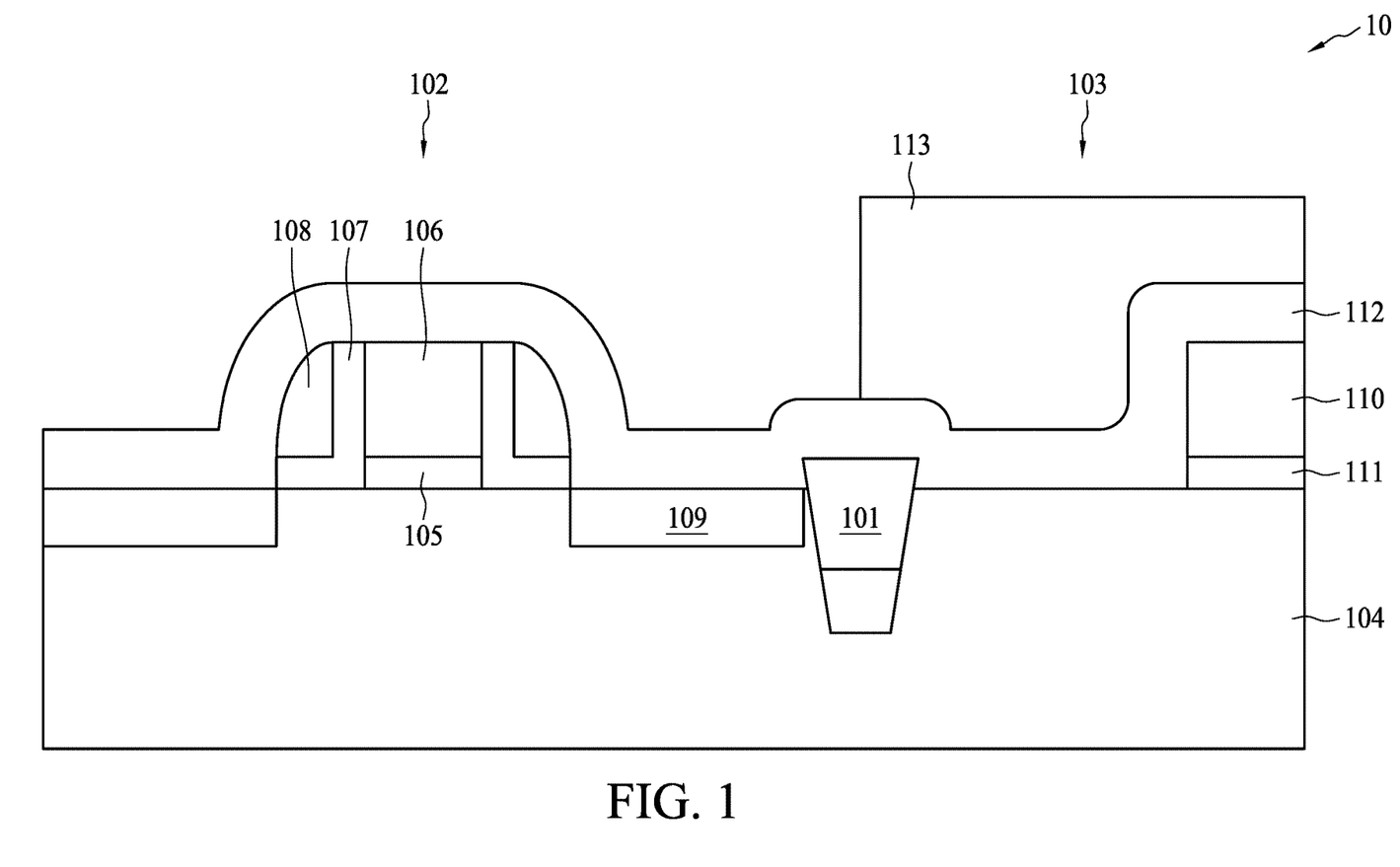
FIG. 1 to FIG. 2 illustrates cross-sectional views of a semiconductor device in a fabrication process.
Figure 2:
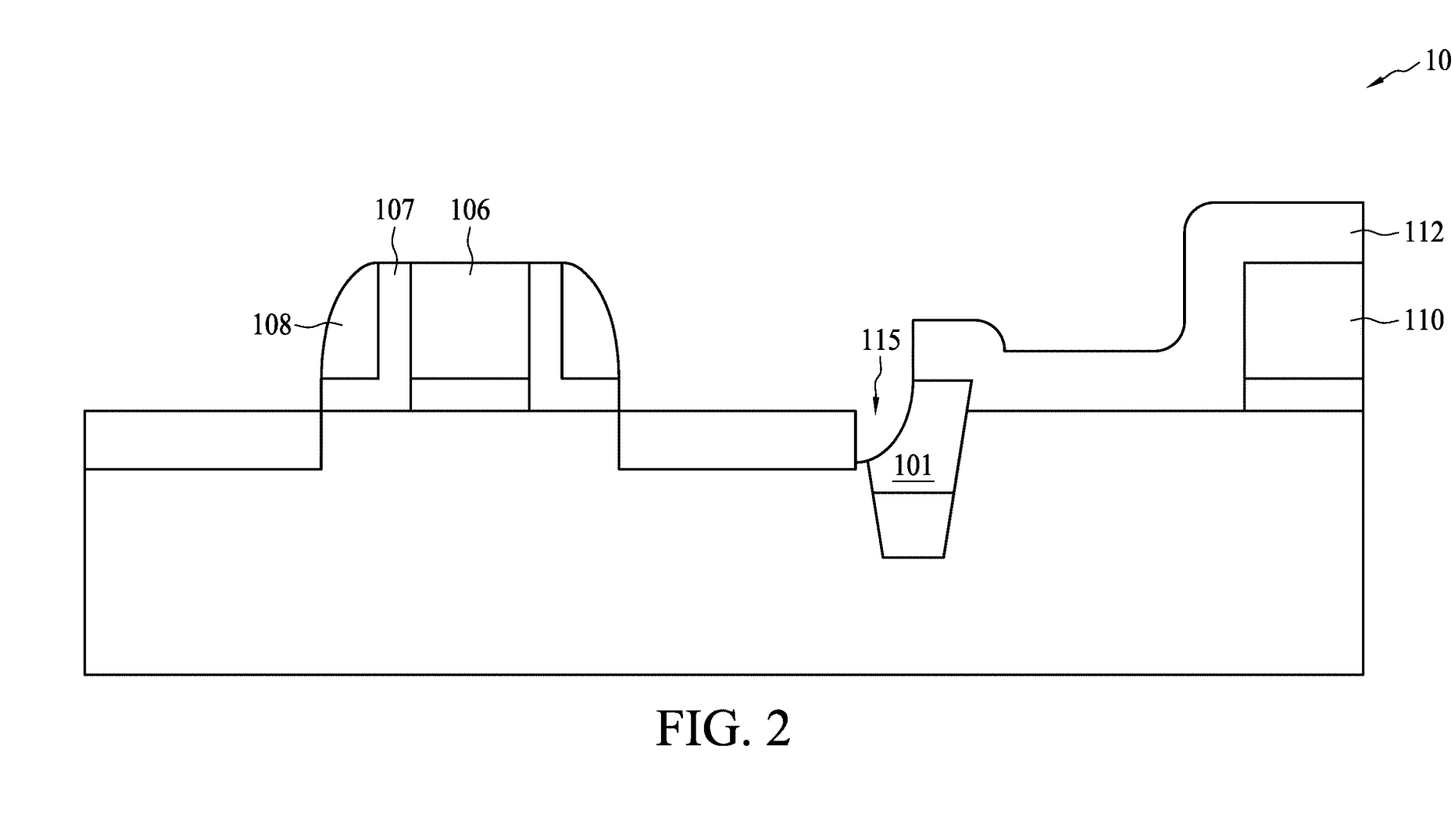

FIG. 1 to FIG. 2 illustrates cross-sectional views of a semiconductor device 10 in a fabrication process. A Shallow Trench Isolation (STI) 101 defines a first area 102 and second area 103 on a semiconductor substrate 104. In the first area 102, a gate oxide layer 105 separates a gate electrode 106 from the semiconductor substrate 104. Spacer liners 107 and spacers 108 are formed on the side walls of the gate electrode 106. Source/drain regions 109 are formed adjacent to the spacers 108 in the semiconductor substrate 104. In the second area 103, a passive device, such as a resistor 110 and an insulator layer 111 is formed on the semiconductor substrate 104. A dielectric layer 112 is blanket deposited over the source/drain regions 109, spacers 108, spacer liners 107, gate electrode 106, STI 101 and resistor 110. A photoresist mask 113 is formed on the dielectric layer 112 in such a way to cover the second area 103 and expose the first area 102.

In the semiconductor device 10, only the gate electrode 106 and source/drain regions 109 require a formation of a silicide layer, so that it is desirable to remove the dielectric layer 112 from the first area 102, while keeping it in the second area 103. Accordingly, a photoresist mask 113 is so defined to shield the second area 103 and expose the first area 102. A step of wet etching using an HF solution is performed to remove the exposed part of the dielectric layer 112. Then the photoresist mask 113 is stripped off to leave the semiconductor structure 10, as shown in FIG. 2.

The process of etching the dielectric layer 112 of FIG. 2 has a problem of damaging the STI 101. Because the STI 101 is made of oxide materials, their etch rate would be very close to the dielectric layer 112. In a 100:1 HF solution, the etch rate for the dielectric layer 112 is about 70 Angstroms per minute, and the etch rates for the STI 101 are about 50 Angstroms per minute. Thus, using the HF solution to etch the dielectric layer 112 may be unselective with respect to the STI 101. The divot 115 is often formed after the wet etching process. After formation of a silicide layer on a source or drain region, the silicide layer may be also formed in the divot and therefore causing higher junction leakage. In addition, imperfections and stress at edge of the STI 101 are important origins to affect device flicker noise characteristics.

FIGS. 3A, 4A, 5A, 6A and 7A are diagrams illustrating fragmentary layout views of a semiconductor device 300 at various stages of fabrication in accordance with some embodiments of the disclosure. FIGS. 3B, 4B, 5B, 6B and 7B are diagrams illustrating fragmentary cross-sectional views of the semiconductor device 300 at various stages of fabrication in accordance with some embodiments of the disclosure. Each of FIGS. 3B, 4B, 5B, 6B and 7B includes two cross-sectional diagrams taken along a line AA' and a line BB' the semiconductor device 300 of of each of FIGS. 3A, 4A, 5A, 6A and 7A respectively. At left-hand sides of FIGS. 3B, 4B, 5B, 6B and 7B, cross-sectional diagrams 300A are taken along the line AA'. On the other hand, cross-sectional diagrams 300B at right-hand sides of FIGS. 3B, 4B, 5B, 6B and 7B are taken along the line BB'.

Figure 3A:
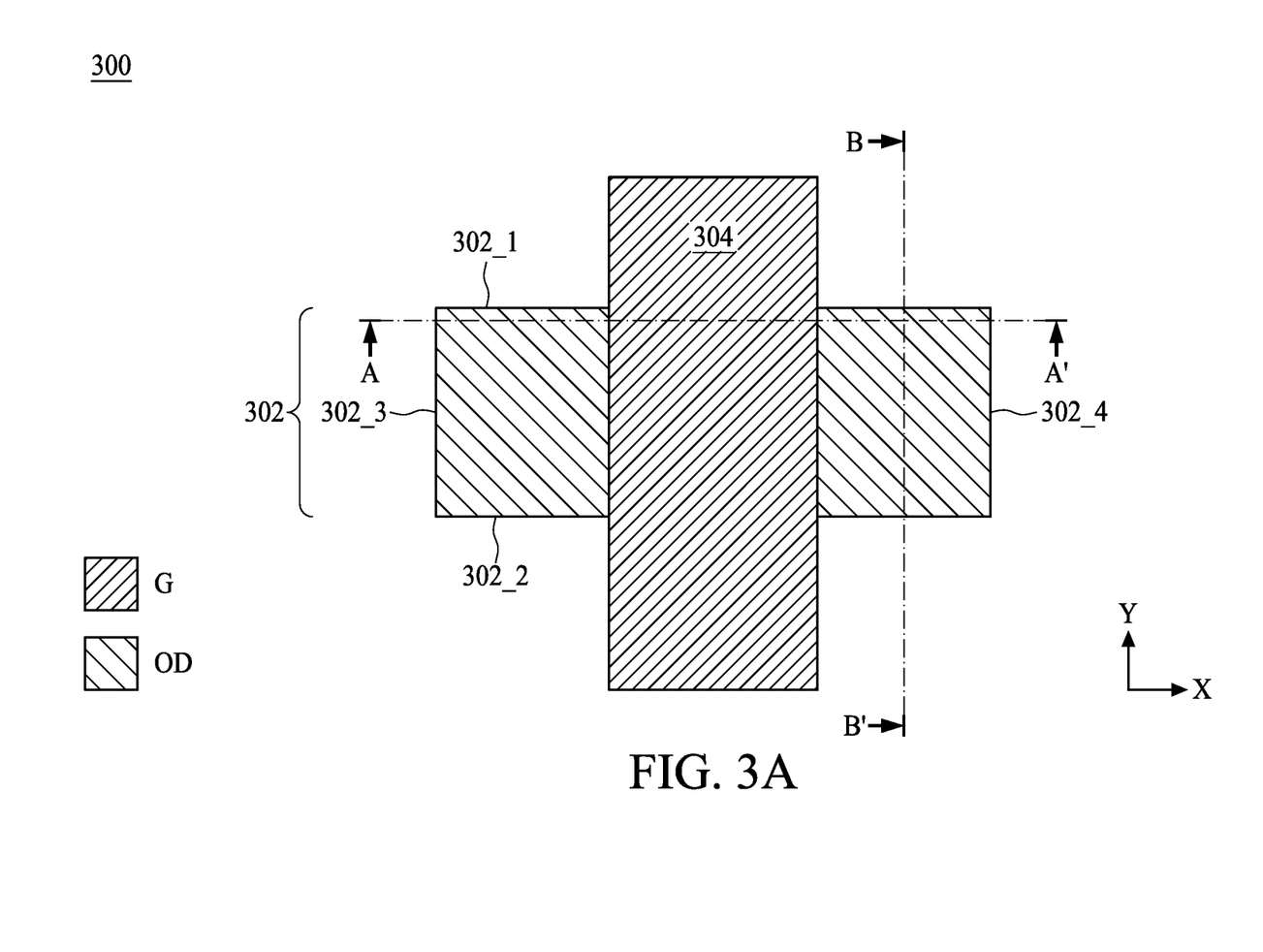
FIGS. 3A, 4A, 5A, 6A and 7A are diagrams illustrating fragmentary layout views of a semiconductor device at various stages of fabrication in accordance with some embodiments of the disclosure.

Referring to FIG. 3A, the semiconductor device 300 includes a gate structure 304, and an active area pattern 302. The gate structure 304 extends continuously over the active area pattern 302. In particular, the gate structure 304 extends beyond the active area pattern 302 along an axis Y. As shown in FIG. 3A, the active area pattern 302 is exposed at both sides of the gate structure 304 along an axis X. In particular, the active area pattern 302 includes two portions arranged at opposite sides of the gate structure 304, and configured to form corresponding drain or source regions of a transistor. The active area pattern 302 further includes a channel region sandwiched between the drain or source regions. Examples of the transistor comprised of at least the gate structure 304 and the active area pattern 302 includes, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, etc. In at least one embodiment, the transistor is an n-channel metal-oxide semiconductor (NMOS) transistor. In at least one embodiment, the transistor is a p-channel metal-oxide semiconductor (PMOS) transistor.

An example material of the gate structure 304 includes polysilicon. Other materials, such as metals, are within the scope of various embodiments. Example materials of the active area pattern 302 include, but are not limited to, semiconductor materials doped with various types of p-dopants and/or n-dopants. In at least one embodiment, the active area pattern 302 includes dopants of the same type at both sides of the gate structure 304.

Figure 3B:
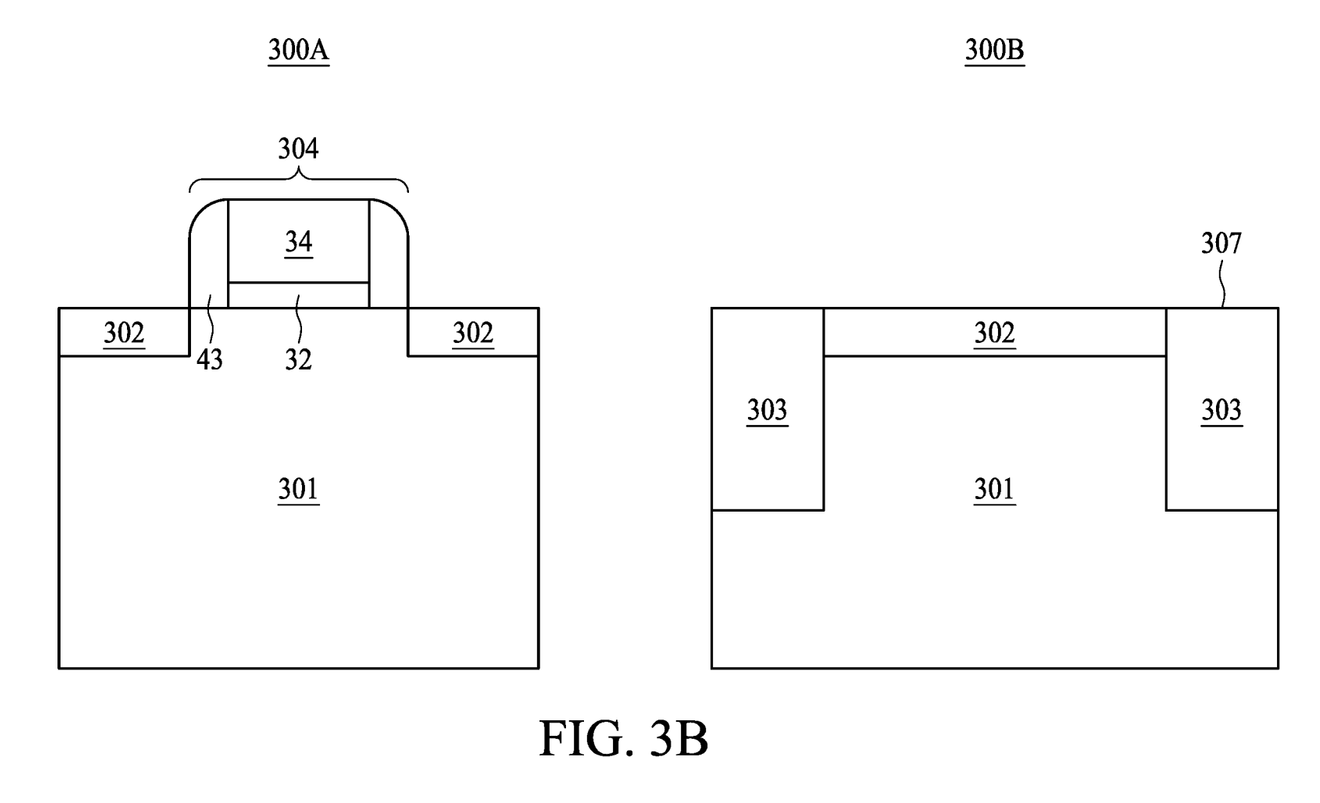
FIGS. 3B, 4B, 5B, 6B and 7B are diagrams illustrating fragmentary cross-sectional views of the semiconductor device at various stages of fabrication in accordance with some embodiments of the disclosure.

With respect to the cross-sectional diagram 300A of FIG. 3B, the gate structure 304 is formed over a top surface 307 a semiconductor substrate 301. The semiconductor substrate 301 may be a portion of a semiconductor wafer such as a silicon wafer. Alternatively, the semiconductor substrate 301 may include other semiconductor materials such as germanium. The semiconductor substrate 301 may also include a compound semiconductor such as silicon carbon, gallium arsenic, indium arsenide, indium phosphide, III-V compound semiconductor materials, or the like. The semiconductor substrate 301 may be a bulk semiconductor substrate, and an epitaxial layer may be, or may not be, formed on the bulk substrate. Furthermore, the semiconductor substrate 301 may be a Semiconductor-On-Insulator (SOI) substrate.

In some embodiments, the gate structure 304 may include a gate dielectric 32 and a gate electrode 34 overlying the gate dielectric 32. In some exemplary embodiments, the gate dielectric 32 may include silicon dioxide. Alternatively, the gate dielectric 32 may include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric 32 may be formed using Chemical Vapor Deposition (CVD), Atomic Layer Deposition (ALD), thermal oxide, and the like.

The gate electrode 34 may include polycrystalline silicon (polysilicon). Alternatively, the gate electrode 34 may include a metal or a metal silicide such as Al, Cu, W, Ni, Mo, Co, Ti, Ta, TiN, TaN, NiSi, NiPtSi, CoSi, or combinations thereof. The formation methods of the gate electrode 34 include CVD, Physical Vapor Deposition (PVD), ALD, and other proper processes. The formation of the gate dielectric 32 and the gate electrode 34 may include forming a blanket dielectric layer and a blanket gate electrode layer, and then performing a patterning to form the gate dielectric 32 and the gate electrode 34.

The gate spacers 43 may be formed by depositing a dielectric layer(s), and then patterning the dielectric layers to remove the horizontal portions deposited on the top surface 307, while the vertical portions of the dielectric layers on the sidewalls of the gate structure 30 are left to from the gate spacers 43. The formation process of the active area pattern 302, i.e. the drain or source regions, may include forming a photo resist (not shown), and then performing an implantation to form the active area pattern 302 in the semiconductor substrate 301.

With respect to the cross-sectional diagram 300B, insulation regions 303 are formed in the semiconductor substrate 301 to define and electrically isolate the active area pattern 302, in which the transistor is formed. In other words, the insulation regions 303 surrounds the active area pattern 302 from a top view. The insulation regions 303 may be Shallow Trench Isolation (STI) regions or Local Oxidation of Silicon (LOCOS) regions. The STI can be formed by steps of photolithography, trench etching and trench filling with an oxide layer. The LOCOS isolation can be formed by steps of depositing a protective nitride layer and locally oxidizing parts of a semiconductor substrate uncovered by the protective nitride layer.

Figure 4A:
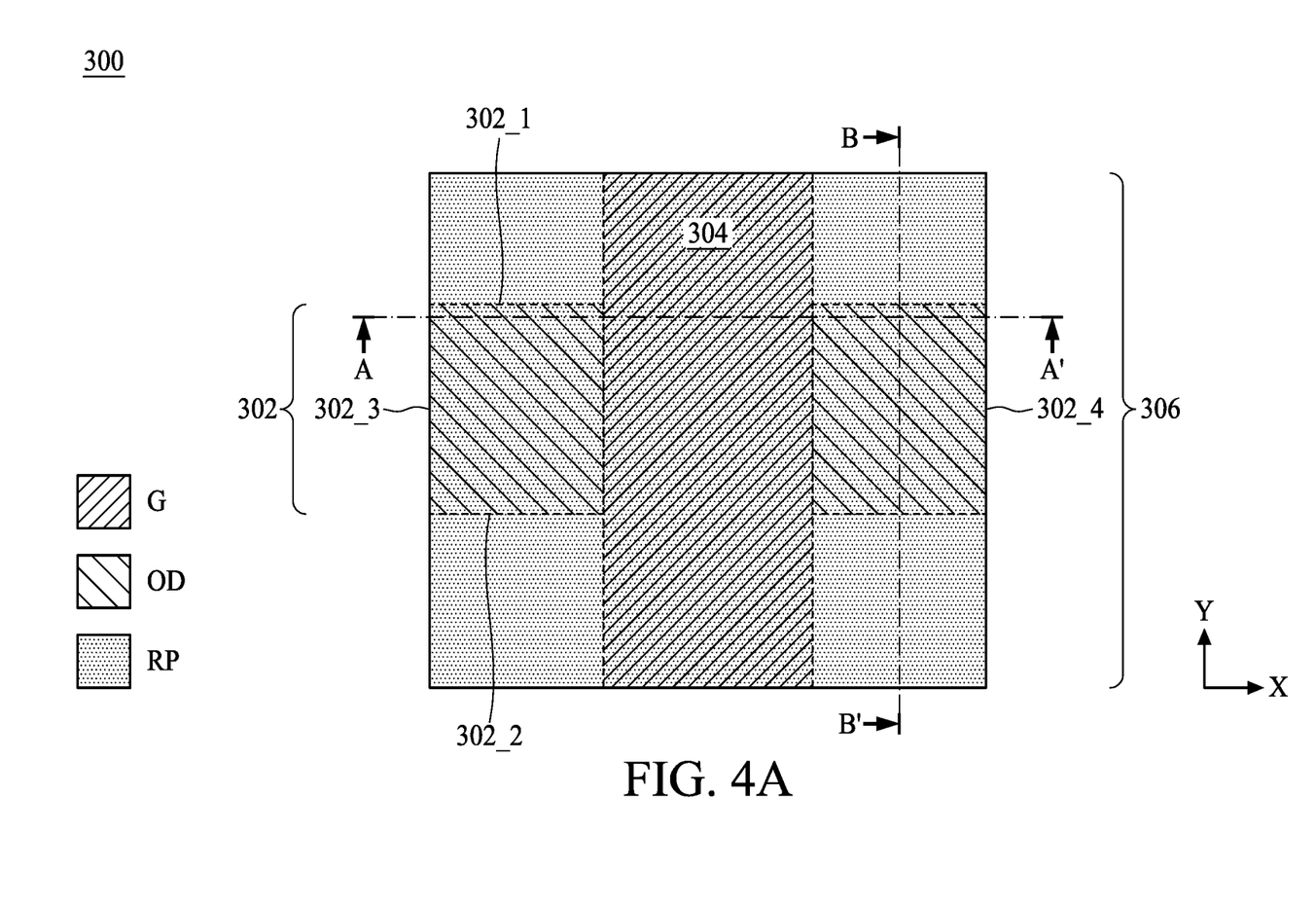
Figure 4B:
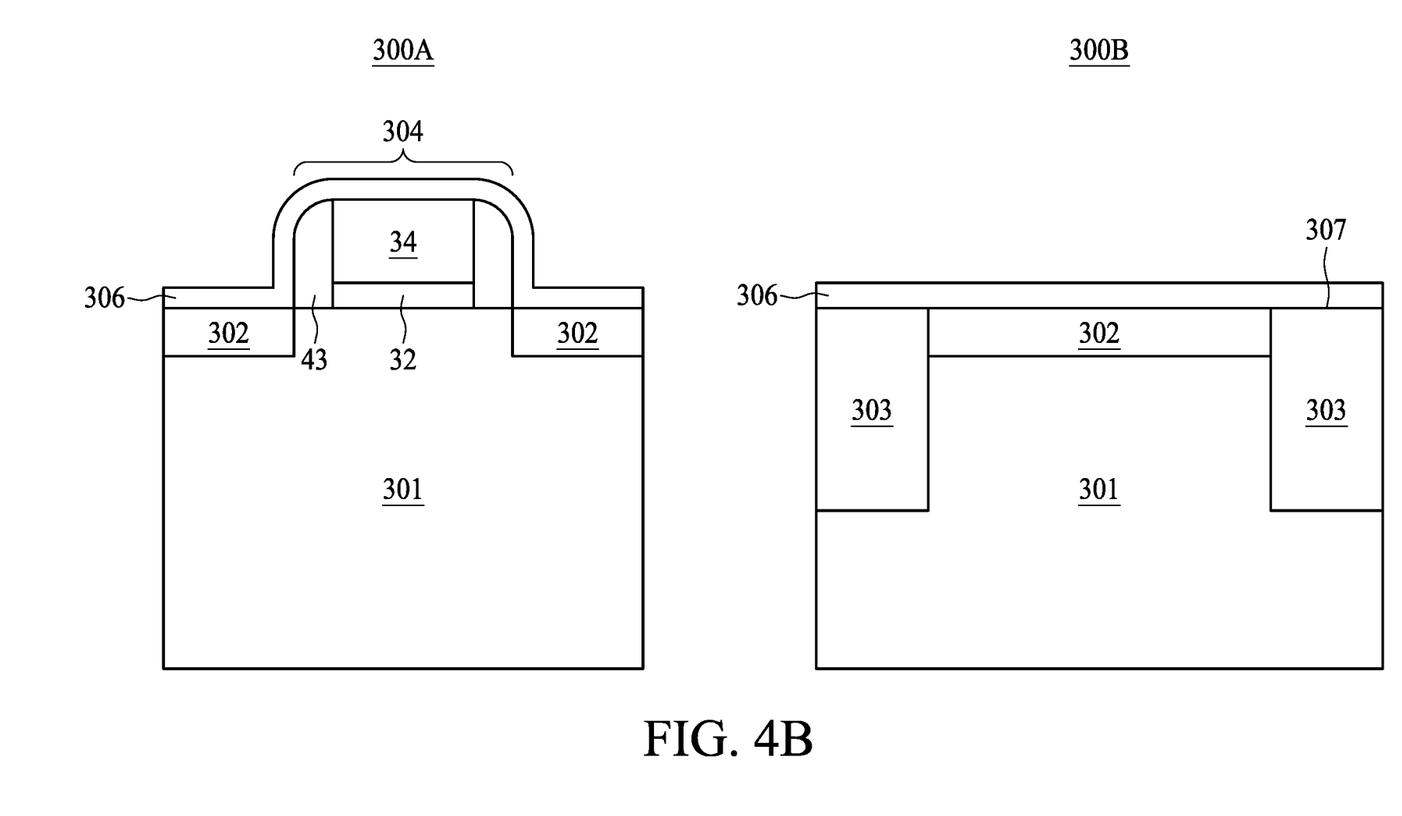

Referring to FIG. 4A, a dielectric layer 306 is formed over the semiconductor device 300 of FIG. 3A to at least in contact with the active area pattern 302, the gate structure 304 and the insulation regions 303. The dielectric layer 306 may include silicon oxide or other types of dielectric materials including, and not limited to, silicon carbide, silicon nitride, silicon oxynitride (SiON), oxygen-doped silicon nitride, nitrided oxides, combinations thereof, and multilayers thereof. Referring to FIG. 4B, the dielectric layer 306 is blanket deposited over the gate structure 304, the active area pattern 302, the insulation regions 303. In some embodiments, the dielectric layer 306 may be conformally deposited over the gate structure 304. In this embodiment, the step of deposition may be Low Pressure Chemical Vapor Deposition (LPCVD), Rapid Thermal Chemical Vapor Deposition (RTCVD), Plasma-Enhanced Chemical Vapor Deposition (PECVD) or Atomic Layer Deposition (ALD). The temperature is suggested to be lower than 600 degrees Celsius, and may be between 400 to 500 degrees Celsius in many instances. The suggested pressure is between 0.1 and 10 torrs. The thickness of the dielectric layer 306 is suggested to be from 10 to 1000 Angstroms, and may be from 200 to 600 Angstroms in many instances.

Figure 5A:
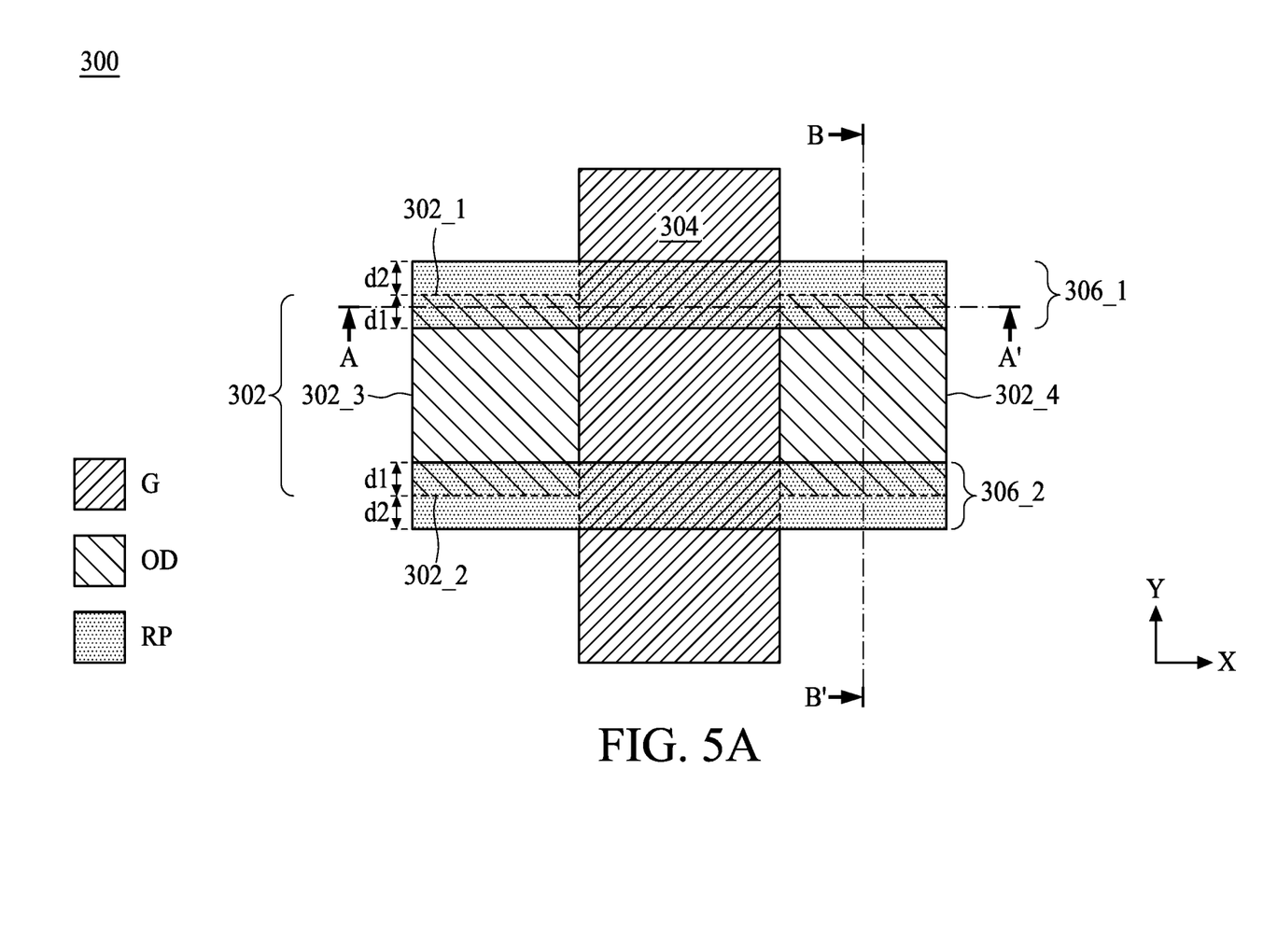

Referring to FIG. 5A, a portion of the dielectric layer 306 is removed to expose a portion of the active area pattern 302, the gate structure 304 and the insulation regions 303. The removing of the dielectric layer 306 may be performed through forming a photoresist mask on the dielectric layer 306 using existing photolithography and then etching the dielectric layer 306 uncovered by the photoresist mask, thereby exposing predetermined areas. The remaining dielectric layers 306_1 and 306_2 are left over to prevent silicide formation. In particular, the remaining dielectric layer 306_1 is left over the region around a topmost edge 302_1 of the active area pattern 302 between the active area pattern 302 and the adjoining insulation regions 303. The remaining dielectric layer 306_2 is left over the region around a bottommost edge 302_2 of the active area pattern 302 between the active area pattern 302 and the adjoining insulation regions 303. In some embodiments, the remaining dielectric layer 306_1 and the remaining dielectric layer 306_2 may be in rectangular shape and across the gate structure 304. Therefore the dielectric layers 306_1 and 306_2 overlap a portion of the gate structure 304.

In some embodiment, the remaining dielectric layer 306_1 overlaps a portion of the active area pattern 302 abutting the topmost edge 302_1 with an overlapping width d1 along the axis Y. The remaining dielectric layer 306_2 overlaps a portion of the active area pattern 302 abutting the bottommost edge 302_2 with the overlapping width d1 along the axis Y. In some embodiments, the overlapping width d1 may be greater than about 0.2 µm. In some embodiments, the overlapping width d1 may be in a range from about 0.2 µm to about 0.25 µm. The remaining dielectric layer 306_1 further upwardly extends beyond the topmost edge 302_1 of the active area pattern 302 to overlap the insulation regions 303 adjoining the topmost edge 302_1 with an overlapping width d2 along the axis Y. The remaining dielectric layer 306_2 further downwardly extends beyond the bottommost edge 302_2 of the active area pattern 302 to overlap the insulation regions 303 adjoining the bottommost edge 302_2 with the overlapping width d2 along the axis Y. In some embodiments, the overlapping width d2 may be greater than about 0.2 µm. In some embodiments, the overlapping width d2 may be in a range from about 0.2 µm to about 0.25 µm. A width d3 along the axis Y of the active area pattern 302 uncovered by the remaining dielectric layers 306_1 and 306_2 may be greater than about 0.5 µm.

In some embodiments, a left end and a right end of each of the remaining dielectric layers 306_1 and 306_2 may be aligned with a leftmost edge 302_3 and a rightmost edge 302_4 of the active area pattern 302 respectively. However, this is not a limitation of the present disclosure. In some embodiments, the left end and/or the right end of each of the remaining dielectric layers 306_1 and 306_2 may extend beyond the leftmost edge 302_3 and/or the rightmost edge 302_4 of the active area pattern 302 respectively along the axis X. In some embodiments, the left end and/or the right end of each of the remaining dielectric layers 306_1 and 306_2 may not extend to the leftmost edge 302_3 and/or a rightmost edge 302_4 of the active area pattern 302 respectively along the axis X.

Figure 5B:
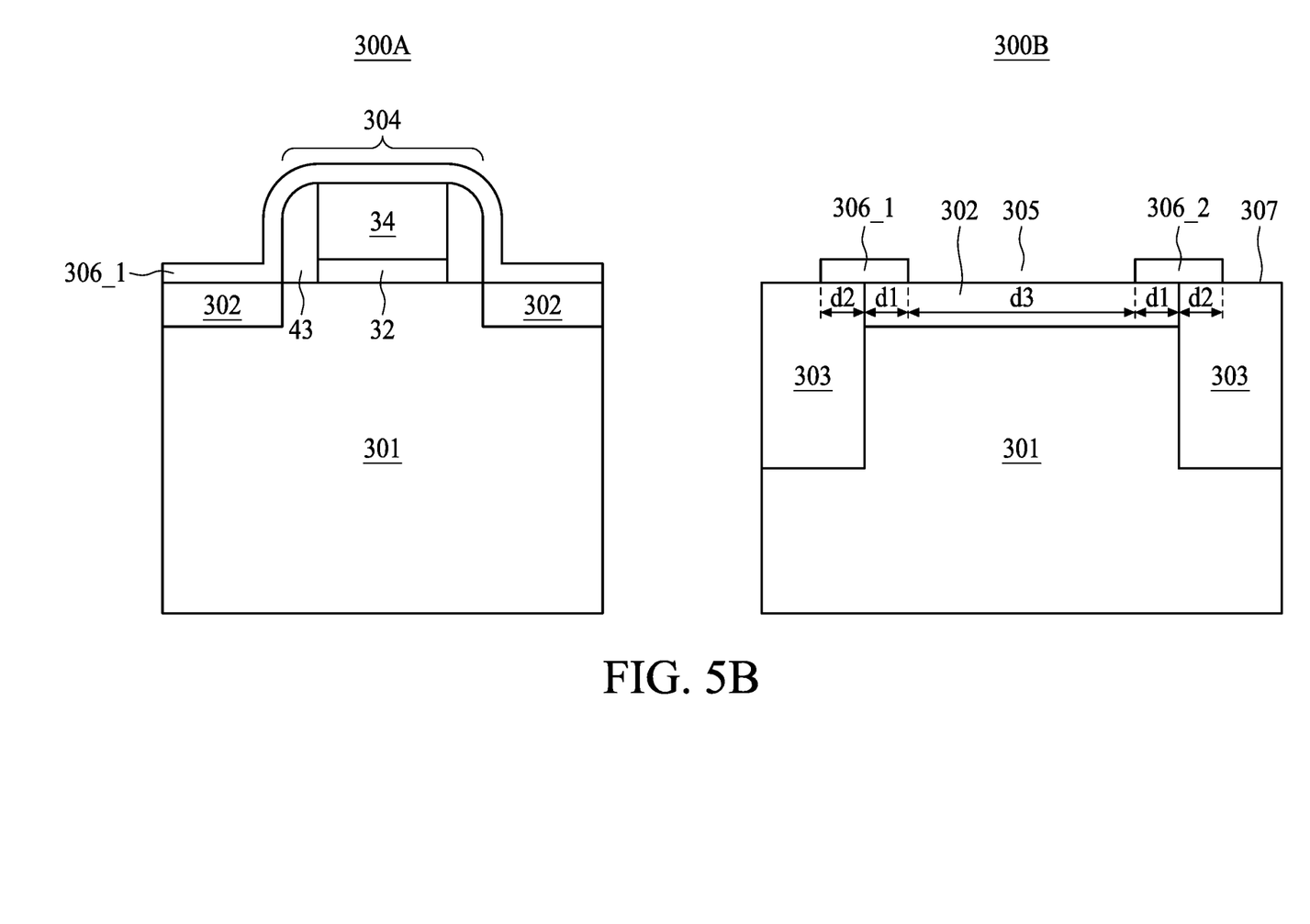
Figure 6A:
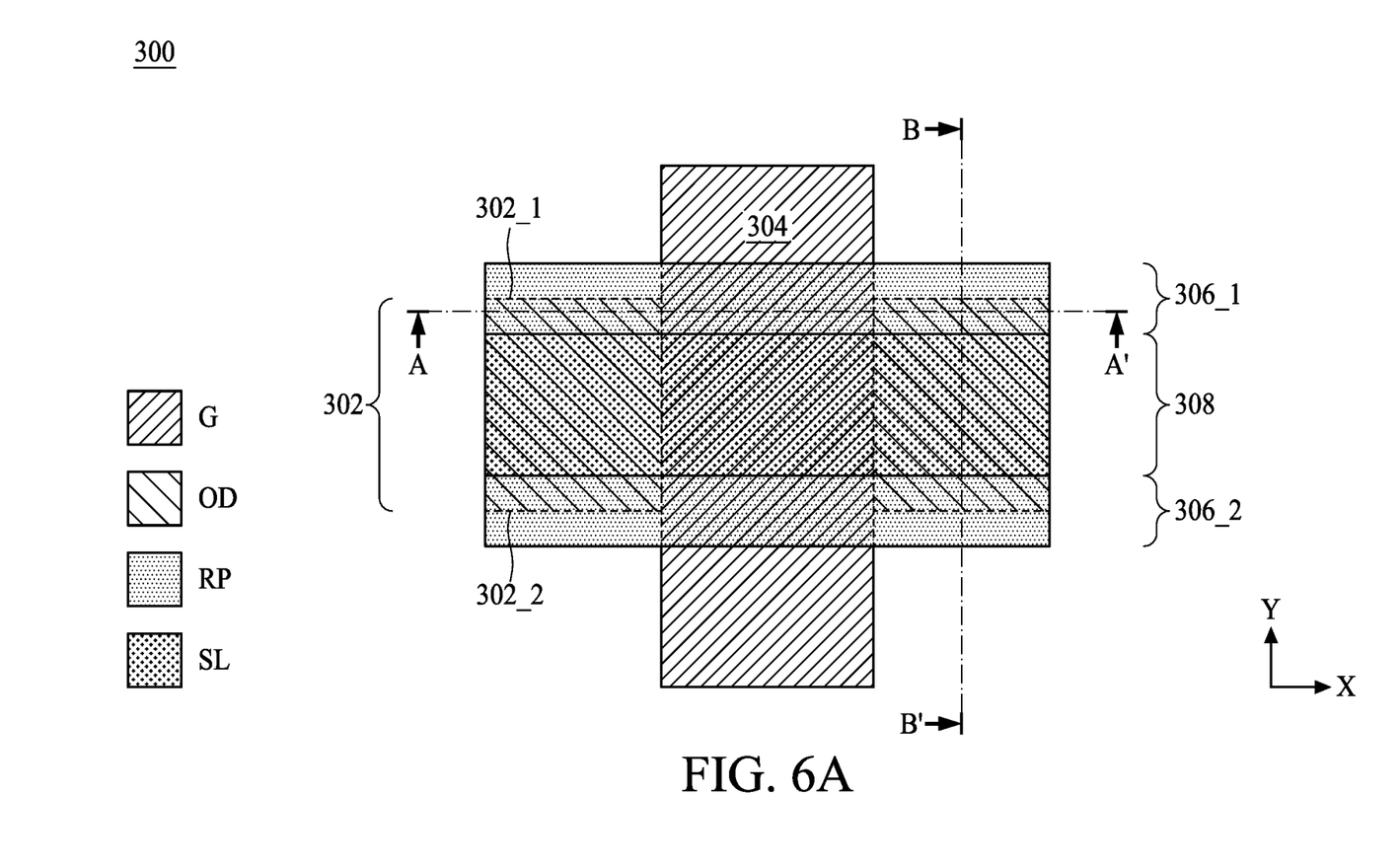
Figure 6B:
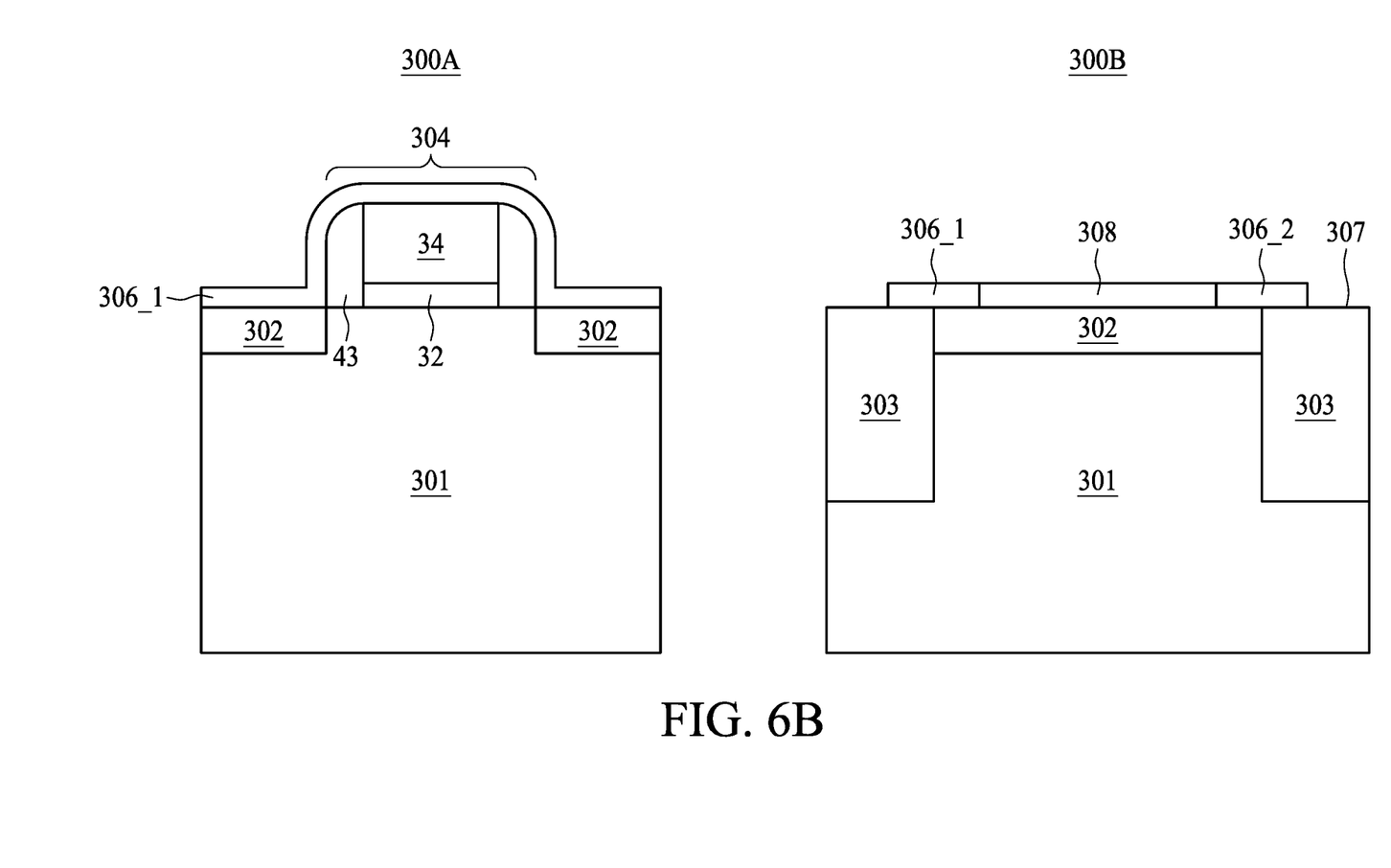

Referring to FIG. 5B, a portion of the dielectric layers 306 is removed to form at least an opening 305 with the width d3. As such, a portion of the active area pattern 302 is exposed through the opening 305. Referring to FIG. 6A in conjunction with FIG. 6B, silicide region 308 is formed over a portion of the active area pattern 302 and a portion of the gate structure 304. In some embodiments, the formation of the silicide region 308 may include a self-aligned silicide (salicide) process. The silicide process include blanket depositing a metal layer (not shown) on the semiconductor device 300 shown in FIG. 5A and FIG. 5B, followed by an anneal to cause the reaction between the metal layer and the underlying silicon. The silicide region 308 is thus formed. The metal layer may include nickel, cobalt, titanium, platinum, or the like. The Unreacted portion of the metal layer is then removed. Due to the masking of the remaining dielectric layers 306_1 and 306_2, the resulting silicide region 308 is formed in the opening 305 between the remaining dielectric layers 306_1 and 306_2. Therefore, the silicide region 308 laterally abuts the remaining dielectric layers 306_1 and 306_2. The silicide region 308 does not extend to the topmost edge 302_1 and the bottommost edge 302_2 between the active area pattern 302 (i.e. the drain or source regions) of the transistor and the insulation regions 303.

Figure 7A:
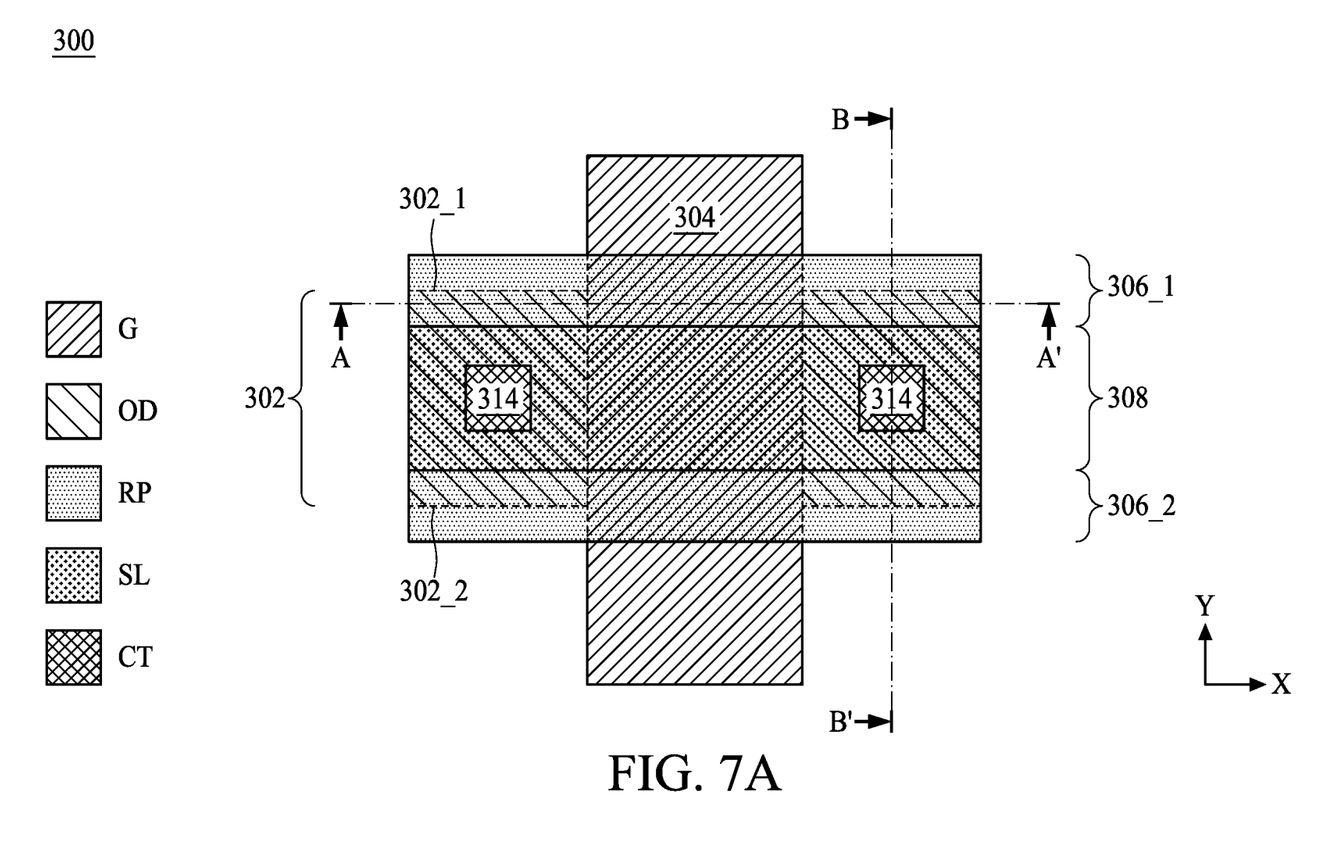
Figure 7B:
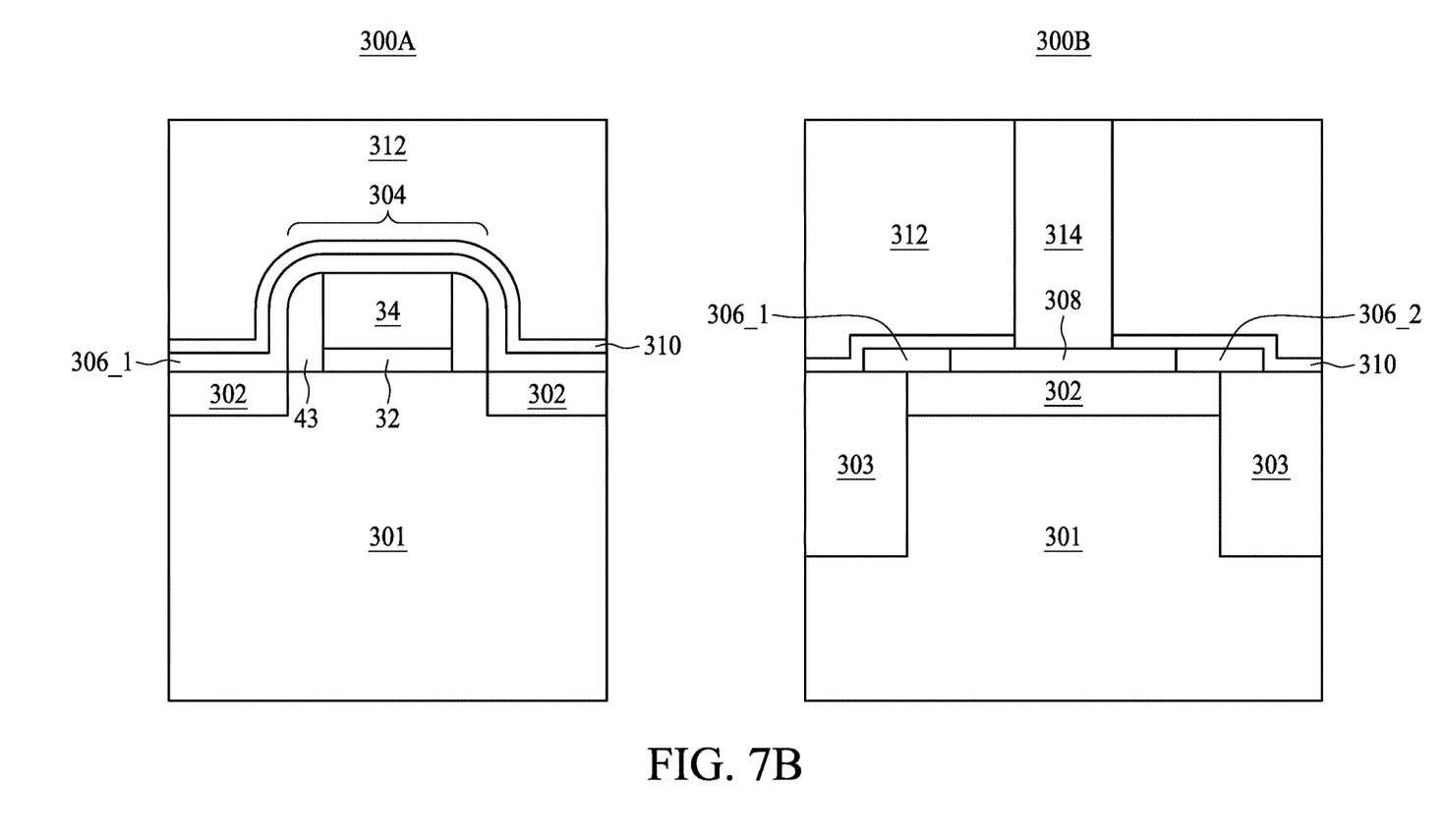

FIG. 7A and FIG. 7B illustrate the formation of an insulating dielectric layer 310, such as a Contact Etch Stop Layer (CESL), and contact plugs 314. The insulating dielectric layer 310 covers, and are in contact with, the silicide region 308 and the remaining dielectric layers 306_1 and 306_2. The insulating dielectric layer 310 may be formed of dielectric materials such as silicon oxide, silicon nitride, or combinations thereof. Furthermore, the material of the insulating dielectric layer 310 may be selected to be different from that of the remaining dielectric layers 306_1 and 306_2, so that in the etching of the insulating dielectric layer 310 and an overlying Inter-Layer Dielectric (ILD) layer 312 for forming the contact openings, there is a high etching selectivity between the insulating dielectric layer 310 and the remaining dielectric layers 306_1 and 306_2.

Following the formation of the insulating dielectric layer 310, the ILD layer 312 is formed. The ILD layer 312 may be formed by a suitable technique, such as chemical vapor deposition (CVD). For example, a high density plasma CVD can be implemented to form the ILD layer 312. The ILD layer 312 may be formed on the semiconductor substrate 301 to a level above a top surface of the insulating dielectric layer 310 above the gate structure 304 such that the gate structure 304 is embedded in. In various embodiments, the ILD layer 312 includes silicon oxide, low-k dielectric material (dielectric material with dielectric constant less than about 3.9, the dielectric constant of the thermal silicon oxide). In one embodiment, a chemical mechanical polishing (CMP) process may be further applied to the ILD layer 312 to planarize the top surface of the ILD layer 312. The processing conditions and parameters of the CMP process, including slurry chemical and polishing pressure, can be tuned to partially remove and planarize the ILD layer 312.

The contact openings are then formed in the ILD 312 and the insulating dielectric layer 310 by a lithography process and an etching process including one or more etching steps, so that the silicide region 308 is exposed through the contact openings. In the formation of the contact openings, the ILD 312 is first etched, with the insulating dielectric layer 310 acting as the etch stop layer. After the etch stops on the insulating dielectric layer 310, the exposed portions of the insulating dielectric layer 310 in the contact openings are etched. The etch of the insulating dielectric layer 310 stops on the silicide region 308. In the situation (as illustrated) that the contact openings are misaligned with the respective silicide region 308, the remaining dielectric layers 306_1 and 306_2 may be exposed in the contact openings. Accordingly, in the etch of the insulating dielectric layer 310, the remaining dielectric layers 306_1 and 306_2 may act as the etch stop layer, and may be substantially un-etched, or at least have a lower portion left after the etch of the insulating dielectric layer 310 is finished. Accordingly, the topmost edge 302_1 and the bottommost edge 302_2 between the active area pattern 302, i.e. the drain or source regions, and the insulation regions 303 are protected by the remaining dielectric layers 306_1 and 306_2.

The contact plugs 314 are then formed in the contact openings to in contact with the silicide region 308. In some embodiments, the contact plugs 314 include tungsten. The formation process may include filling a conductive material, such as tungsten, into the contact openings by using physical vapor deposition (PVD), plating or combination thereof, and then preforming a Chemical Mechanical Polish (CMP) to remove excess portions of the conductive material from over the ILD 312. The remaining portions of the conductive material form the contact plugs 314.

In many embodiments, an interconnect structure may be further formed on the ILD layer 312. The interconnect structure may include vertical interconnects, such as conventional vias or contacts, and horizontal interconnects, such as metal lines. The interconnect structure may implement various conductive materials including copper, tungsten and silicide. In one example, a damascene process is used to form copper related interconnect structure. Although the semiconductor device 300 and formation of the semiconductor device 300 are described, other alternatives and embodiments can be present without departure from the scope of the present disclosure. In addition, it is appreciated that the transistor included in the semiconductor device 300 may be of different types including, and not limited to, a high voltage MOSFET, a low voltage MOSFETs such as logic MOSFETs, memory MOSFETs, and the like. In some embodiments, the transistor may be a p-type MOSFET. In some embodiments, the transistor may be an n-type MOSFET with the conductivity types of the respective doped regions inverted from that of p-type MOSFETs.

Some embodiments of the present disclosure provide a semiconductor structure. The semiconductor structure includes: a substrate; an active area including a channel region sandwiched between two source/drain regions; an insulation region surrounding the active area from a top view; and a dielectric layer disposed over and in contact with an interface between the insulation region and the source/drain regions.

Some embodiments of the present disclosure provide a semiconductor structure. The semiconductor structure includes: a semiconductor substrate; a gate structure over the semiconductor substrate, the gate structure extending along a first direction; an active area pattern in the semiconductor substrate, the active area pattern extending along a second direction perpendicular to the first direction, wherein the active area pattern includes a first edge and a second edge along the second direction; an insulation region surrounding the active area pattern; a first dielectric strip over the semiconductor substrate, wherein the first dielectric strip at least directly covers an interface between the first edge of the active area pattern and the insulation region; and a second dielectric strip over the semiconductor substrate, the second dielectric strip being spaced apart from the first dielectric strip, wherein the second dielectric strip at least directly covers an interface between the second edge of the active area pattern and second insulation region.

Some embodiments of the present disclosure provide a method of manufacturing a semiconductor structure. The method includes: receiving a semiconductor substrate; forming an insulation region in the semiconductor substrate to define an active region in the semiconductor substrate; forming a gate structure across the active region defined in the semiconductor substrate; forming a source or drain region in the active region, wherein the source or drain region adjoins the insulation region; and forming a resist protective dielectric film over the source or drain region, the insulation region, and the gate structure, wherein the resist protective dielectric film overlaps an interface between the source or drain region and the insulation region, and exposes a portion of the source or drain region and a portion of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an active area including a channel region and two source/drain regions, the channel region being sandwiched between the two source/drain regions, wherein the two source/drain regions includes a source region and a drain region;
an insulation region surrounding the active area from a top view; and
a dielectric layer disposed across the channel region from the source region to the drain region, wherein the dielectric layer is over and covering a first interface between the insulation region and the source/drain regions;
wherein
a second interface between the insulation region and the source region is perpendicular to the first interface, and a portion of the second interface is free from being covered by the dielectric layer; and
a third interface between the insulation region and the drain region is perpendicular to the first interface, and a portion of the third interface is free from being covered by the dielectric layer, wherein from a top view, a strip region of the active area is free from being covered by the dielectric layer, and the strip region continuously extends along a direction from the second interface to the third interface.

2. The semiconductor structure of claim 1, further comprising at least one metal silicide feature over and in contact with the active area, wherein the metal silicide feature extends to the second interface and the third interface.

3. The semiconductor structure of claim 2, wherein the metal silicide feature is free from extending to the first interface between the insulation region and the source/drain regions.

4. The semiconductor structure of claim 1, wherein the dielectric layer includes silicon oxide, silicon nitride, or silicon oxynitride.

5. The semiconductor structure of claim 3, wherein the metal silicide feature laterally abuts the dielectric layer.

6. The semiconductor structure of claim 2, further comprising a contact etch stop layer over the dielectric layer and the metal silicide feature.

7. The semiconductor structure of claim 6, further comprising a contact passing through the contact etch stop layer and in contact with the metal silicide feature.

8. The semiconductor structure of claim 1, wherein the dielectric layer overlaps the source/drain regions with an overlapping width substantially greater than about 0.2 µm.

9. The semiconductor structure of claim 1, wherein a thickness of the dielectric layer is in a range from about 200 to 600 Angstroms.

10. A semiconductor structure, comprising:
a semiconductor substrate;
a gate structure over the semiconductor substrate, the gate structure extending along a first direction;
an active area pattern in the semiconductor substrate, the active area pattern extending along a second direction perpendicular to the first direction, wherein the active area pattern includes a first edge and a second edge along the second direction, and the active area pattern further includes a third edge and a fourth edge along the first direction;
an insulation region surrounding the active area pattern;
a first dielectric strip over the semiconductor substrate and being wrapped around the gate structure, wherein the first dielectric strip at least directly covers an interface between the first edge of the active area pattern and the insulation region; and
a second dielectric strip over the semiconductor substrate and being wrapped around the gate structure, the second dielectric strip being spaced apart from the first dielectric strip, wherein the second dielectric strip at least directly covers an interface between the second edge of the active area pattern and second insulation region;
wherein a portion of the third edge and a portion of the fourth edge are free from being covered by the first dielectric strip and the second dielectric strip, and from a top view, a strip region of the active area pattern is free from being covered by the first dielectric strip and the second dielectric strip, and the strip region continuously extends along the second direction from the third edge to the fourth edge.

11. The semiconductor structure of claim 10, further comprising a silicide layer over and in contact with the active area pattern, wherein the silicide feature extends to the third edge and the fourth edge.

12. The semiconductor structure of claim 10, wherein the first dielectric strip and the second dielectric strip further overlap the gate structure respectively.

13. The semiconductor structure of claim 10, wherein the first dielectric strip and the second dielectric strip include silicon oxide, silicon nitride, or silicon oxynitride.

14. The semiconductor structure of claim 11, wherein the silicide layer is between the first dielectric strip and the second dielectric strip.

15. The semiconductor structure of claim 10, wherein each of the first dielectric strip and the second dielectric strip overlaps the active area pattern with an overlapping width substantially greater than about 0.2 µm.

16. The semiconductor structure of claim 10, wherein a thickness of each of the first dielectric strip and the second dielectric strip is in a range from about 10 to 1000 Angstroms.

17. The semiconductor structure of claim 11, further comprising a contact etch stop layer over the first dielectric strip, the second dielectric strip, and the silicide layer.

18. The semiconductor structure of claim 17, further comprising a contact passing through the contact etch stop layer and in contact with the silicide layer.

19. A semiconductor structure, comprising:
a semiconductor substrate;
a gate structure over the semiconductor substrate, the gate structure extending along a first direction;
an active area pattern in the semiconductor substrate, the active area pattern extending along a second direction perpendicular to the first direction;
an insulation region extending along the second direction and neighboring to an edge of the active area pattern;
a resist protective dielectric film wrapped around the gate structure and in contact with a part of the active area pattern and a part of the insulation region so as to cover an interface between the edge of the active area pattern and the insulation region, wherein from a top view, a strip region of the active area pattern is free from being covered by the resist protective dielectric film, and the strip region continuously extends along the second direction from one end of the active area pattern to the other end of the active area pattern; and an insulating dielectric layer cover the resist protective dielectric film, wherein a high etching selectivity is between the insulating dielectric layer and the resist protective dielectric film.

20. The semiconductor structure of claim 19, further comprising a silicide layer over and in contact with the active area pattern, wherein the insulating dielectric layer covers a portion of the silicide layer.

\* \* \* \* \*